(12) United States Patent
Agarwal et al.

(10) Patent No.: US 8,402,398 B2
(45) Date of Patent: Mar. 19, 2013

(54) REDUCING THROUGH PROCESS DELAY VARIATION IN METAL WIRES

(75) Inventors: Kanak B. Agarwal, Austin, TX (US);
Shayak Banerjee, Austin, TX (US);
Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/157,909

(22) Filed: Jun. 10, 2011

(65) Prior Publication Data

US 2012/0317523 A1 Dec. 13, 2012

(51) Int. Cl.
G06F 17/50 (2006.01)
G06F 9/455 (2006.01)
(52) U.S. Cl. ............... 716/53; 716/54; 716/55; 716/132
(58) Field of Classification Search ........................ None
See application file for complete search history.

(56) References Cited

U.S. PATENT DOCUMENTS

| | | | |
|---|---|---|---|
| 6,835,510 B2 | 12/2004 | Chen et al. | |
| 7,418,693 B1 | 8/2008 | Gennari et al. | |
| 7,458,045 B2 | 11/2008 | Cote et al. | |
| 7,694,267 B1 * | 4/2010 | Ye et al. | 716/53 |
| 7,730,433 B2 * | 6/2010 | Hammouda et al. | 716/103 |
| 7,783,999 B2 | 8/2010 | Ou et al. | |
| 7,930,656 B2 * | 4/2011 | Aton et al. | 716/53 |
| 8,146,026 B2 * | 3/2012 | Agarwal et al. | 716/56 |
| 2006/0266833 A1 | 11/2006 | Nehmadi et al. | |
| 2007/0148794 A1 | 6/2007 | Cha et al. | |
| 2009/0125865 A1 * | 5/2009 | Aton et al. | 716/19 |
| 2009/0307642 A1 | 12/2009 | Lai et al. | |
| 2010/0023916 A1 | 1/2010 | Chew et al. | |
| 2010/0180251 A1 * | 7/2010 | Ye et al. | 716/19 |
| 2010/0242000 A1 | 9/2010 | Strenski et al. | |
| 2010/0333049 A1 * | 12/2010 | Agarwal et al. | 716/55 |
| 2011/0119642 A1 * | 5/2011 | Agarwal et al. | 716/50 |
| 2011/0124193 A1 * | 5/2011 | Cheng et al. | 438/669 |
| 2011/0138342 A1 * | 6/2011 | Agarwal | 716/50 |
| 2011/0161895 A1 * | 6/2011 | Reid et al. | 716/53 |
| 2011/0204470 A1 * | 8/2011 | Cheng et al. | 257/499 |

FOREIGN PATENT DOCUMENTS

JP 2008191777 A 8/2008

* cited by examiner

*Primary Examiner* — A. M. Thompson
(74) *Attorney, Agent, or Firm* — Stephen R. Tkacs; Stephen J. Walder, Jr.; Eustus D. Nelson

(57) ABSTRACT

A mechanism is provided for reducing through process delay variation in metal wires by layout retargeting. The mechanism performs initial retargeting, decomposition, and resolution enhancement techniques. For example, the mechanism may perform optical proximity correction. The mechanism then performs lithographic simulation and optical rules checking. The mechanism provides retargeting rules developed based on coupling lithography simulation and resistance/capacitance (RC) extraction. The mechanism performs RC extraction to capture non-linear dependency of RC on design shape dimensions. If the electrical properties in the lithographic simulation are within predefined specifications, the mechanism accepts the retargeting rules; however, if the electrical properties from RC extraction are outside the predefined specifications, the mechanism modifies the retargeting rules and repeats resolution enhancement techniques.

17 Claims, 8 Drawing Sheets

REDUCING THROUGH PROCESS DELAY VARIATION IN METAL WIRES

BACKGROUND

The present application relates generally to an improved data processing apparatus and method and more specifically to mechanisms for reducing through process delay variation in metal wires.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

Due to the unavoidable diffraction, the optical lithography system is lossy in the sense that only low frequency components of the electromagnetic field can pass the optical system. Given a target layout of shapes that are desired to be manufactured, masks are generated that account for the non-linearities introduced by the lithographic process that prints wafer features that resemble the target. As the gap between the required feature size and lithography wavelength gets bigger, the final wafer images are quite different from the patterns on the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Other commonly used RETs are sub-wavelength resolution assist features (SRAF) and phase-shift masks (PSM). Nowadays, considerable amount of computing power has to be dedicated to these post-layout processes (often referred as data prep).

Optical proximity correction OPC involves simulating the wafer image given a mask. OPC extracts the geometric error between the simulated wafer feature and the target. The geometric error is called edge placement error (EPE). A cost function is defined as the summation of the EPEs across a layout and modifications of the mask are performed so as to minimize this cost function. OPC arrives at a final mask solution after several iterations of image simulations and mask modifications. One drawback of this type of mask modification is that the image simulation is performed at a single process point, most often under nominal process conditions. Hence, OPC cannot compensate for any variations that may occur during the lithographic process such as variations in lithographic dose and focus.

Lithographic variations in dose, focus, etc. degrade image quality across the process window. Variations appear in the form of process variability bands (PV-bands) and lead to variability in electrical metrics. For example, metal wires experience resistance/capacitance delay.

In nanometer scale technologies, wafer structures show an increased susceptibility to lithographic variations. This often leads to fails such as shorts and opens of electrical structures, thus also limiting wafer yield. In order to improve yield, a method known as retargeting is employed in current processes. Retargeting is the procedure of modifying target layout shapes prior to handing it off to mask making tool (OPC). Modifying target layout shapes can make layouts more robust to process variability and hence reduce electrical fails. However, it also modifies the electrical properties of the circuit itself, which is often not accounted for during the retargeting process.

SUMMARY

In one illustrative embodiment, a method, in a data processing system, is provided for reducing delay variation in metal wires. The method comprises receiving a design comprising a plurality of metal wires, performing retargeting on the design to form target shapes based on one or more retargeting rules, performing resolution enhancement on the target shapes to form one or more corrected images, and performing lithographic simulation on the one or more corrected images to form a simulated design. The method further comprises determining whether electrical properties of the simulated design meet predefined specifications and responsive to the electrical properties of the simulated design not meeting the predefined specifications, modifying the one or more retargeting rules based on the electrical properties of the simulated design.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for reducing through process delay variation in metal wires by layout retargeting. The mechanism performs initial retargeting, decomposition, and resolution enhancement techniques. For example, the mechanism may perform optical proximity correction. The mechanism then performs lithographic simulation and optical rules checking. The mechanism provides retargeting rules developed based on coupling lithography simulation and resistance/capacitance (RC) extraction. The mechanism performs RC extraction to capture non-linear dependency of RC on design shape dimensions. If the electrical properties in the lithographic simulation are within predefined specifications, the mechanism accepts the retargeting rules; however, if the electrical properties from RC extraction are outside the predefined specifications, the mechanism modifies the retargeting rules and repeats resolution enhancement techniques.

Figure 1:
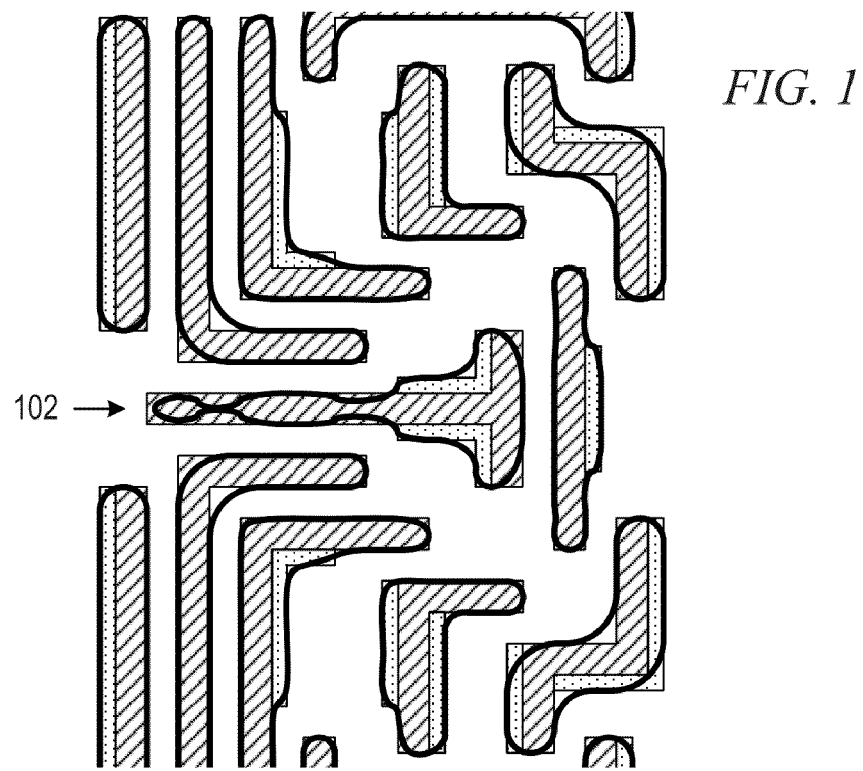
FIG. 1 depicts an example lithographic image with lithographic variations, showing yield issues, in accordance with an illustrative embodiment.

As described previously, the lithographic process used to form metal wires in an integrated circuit may have lithographic variations in dose, focus, etc. These variations degrade image quality across the process window, which leads to variability in electrical metrics. FIG. 1 depicts an example lithographic image with lithographic variations, showing yield issues, in accordance with an illustrative embodiment. As can be seen in FIG. 1, the design shapes may vary with lithographic process variability. Note particularly feature 102, which may experience delay due to variability in electrical properties, i.e., resistance/capacitance (RC) delay variation.

Figure 2:
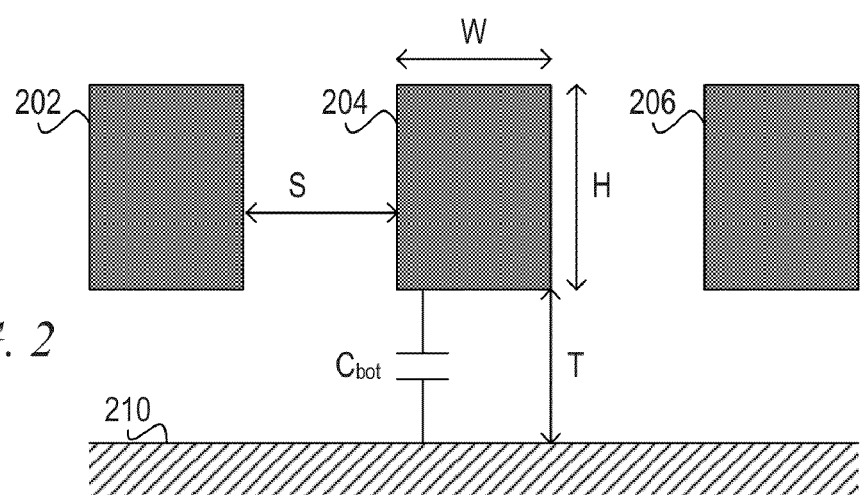
FIG. 2 is a diagram illustrating a two-dimensional model for evaluating wire RC delay (product of resistance and capacitance) as a function of wire dimensions in accordance with an illustrative embodiment.

FIG. 2 is a diagram illustrating wire RC delay (product of resistance and capacitance) with scaling in accordance with an illustrative embodiment. Wire delay is a non-linear function of width (W), thickness (T), height (H), and spacing (S). These dimensions are proportional to RC product. FIG. 2 shows a cross section of wires 202, 204, 206 formed using a lithographic process in a dielectric over a substrate 210. Wire 204, for example, has a width (W) and height (H), a thickness (T) with respect to its distance from substrate 210, and a spacing (S) with respect to adjacent wire 202. Wire 204 and substrate 210 form a capacitor $C_{bot}$.

Wire resistance is a function of width and thickness. Resistance of a wire may be determined as follows:

$$R=\rho/(W*T),$$

where $\rho$ is the metal resistivity. The bottom plate capacitance may be determined as follows:

$$C_{bot}=\epsilon*(1.15(W/H)+2.8(T/H)^{0.222}),$$

where $\epsilon$ is the dielectric permittivity. RC is then a strong function of W. RC is determined as follows:

$$RC=\rho*\epsilon/H^2(1.15/T+2.8/(WT^{0.778}))$$

Figure 3:
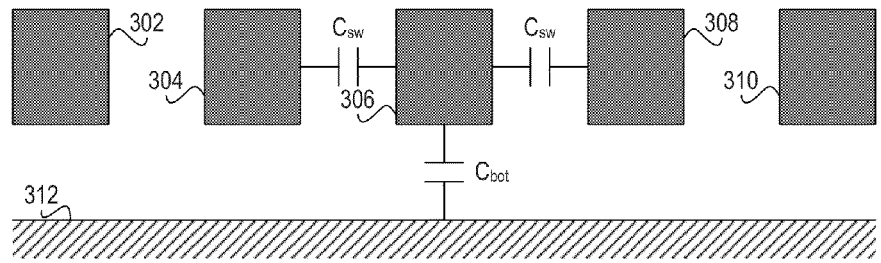
FIG. 3 is a diagram illustrating a two-dimensional model for computing wire RC delay as a function of wire dimensions for wires with neighbors in accordance with an illustrative embodiment.

For metal with neighbors, one must consider sidewall capacitance. FIG. 3 is a diagram illustrating wire RC delay with scaling for wires with neighbors in accordance with an illustrative embodiment. As shown in FIG. 3, wires 302, 304, 306, 308, 310 have resistance and bottom capacitance $C_{bot}$ with respect to substrate 312. In addition, wires 302, 304, 306, 308, and 310 have sidewall capacitance. For example, wires 304 and 306 form a capacitor and wires 306 and 308 form a sidewall capacitor $C_{sw}$.

Figure 4:
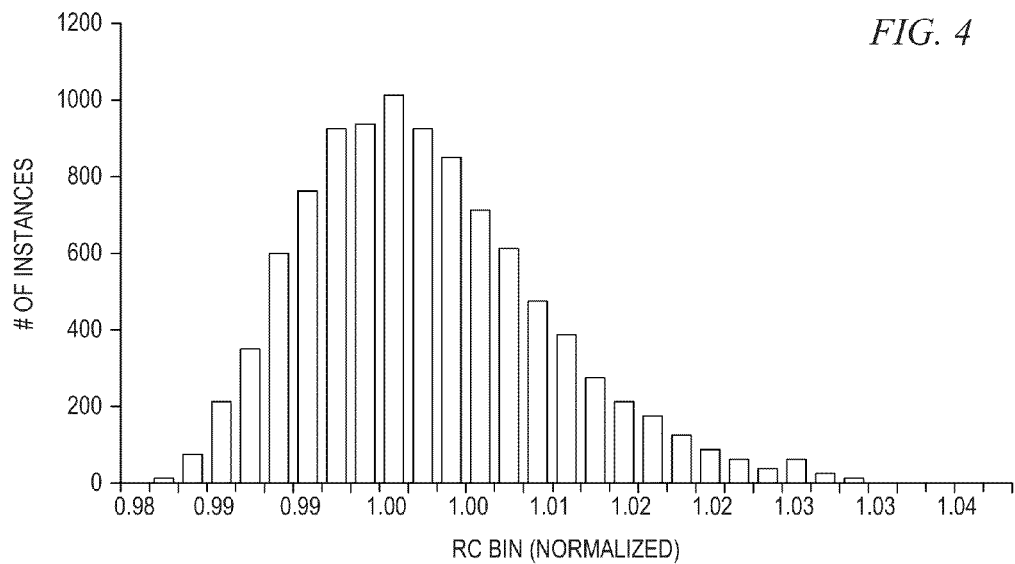
FIG. 4 illustrates RC distribution for metal lines in accordance with an illustrative embodiment.

FIG. 4 illustrates RC distribution for metal lines in accordance with an illustrative embodiment. The dimensions of the wire (W, T, H) are in fact not constant, but a statistical variable, due to variations in the manufacturing process. This means that the resistance/capacitance (RC) product of the wire also varies. The exact nature of the distribution is obtained by Monte-Carlo sampling of the parameters W,T,H and S, assuming Gaussian behavior of these variables. Using the equation above helps translate this dimensional variability to an RC distribution. Note that the RC distribution is asymmetric and is a non-linear transformation from dimensions W, S.

Figure 5:
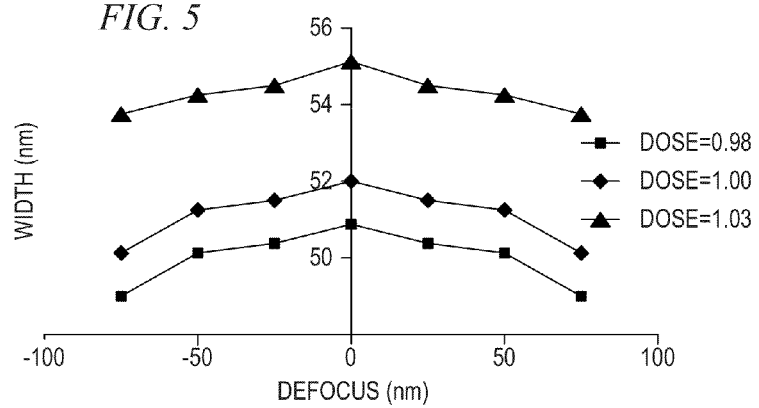
FIG. 5 illustrates how defocus varies with dose in accordance with an illustrative embodiment.

RC is a strong function of manufacturing conditions. The two manufacturing parameters of prime interest in lithography are dose and defocus. Dose relates to variations in the intensity of light used during imaging. Defocus occurs due to changes in the plane of the wafer during printing. FIG. 5 illustrates how the width of printed wires varies with dose and defocus in accordance with an illustrative embodiment. To obtain an optimal design-manufacturing solution, one must couple analysis with optimization. Analysis includes lithographic variability data and RC simulation capability. Optimization includes retargeting techniques.

Figure 6:
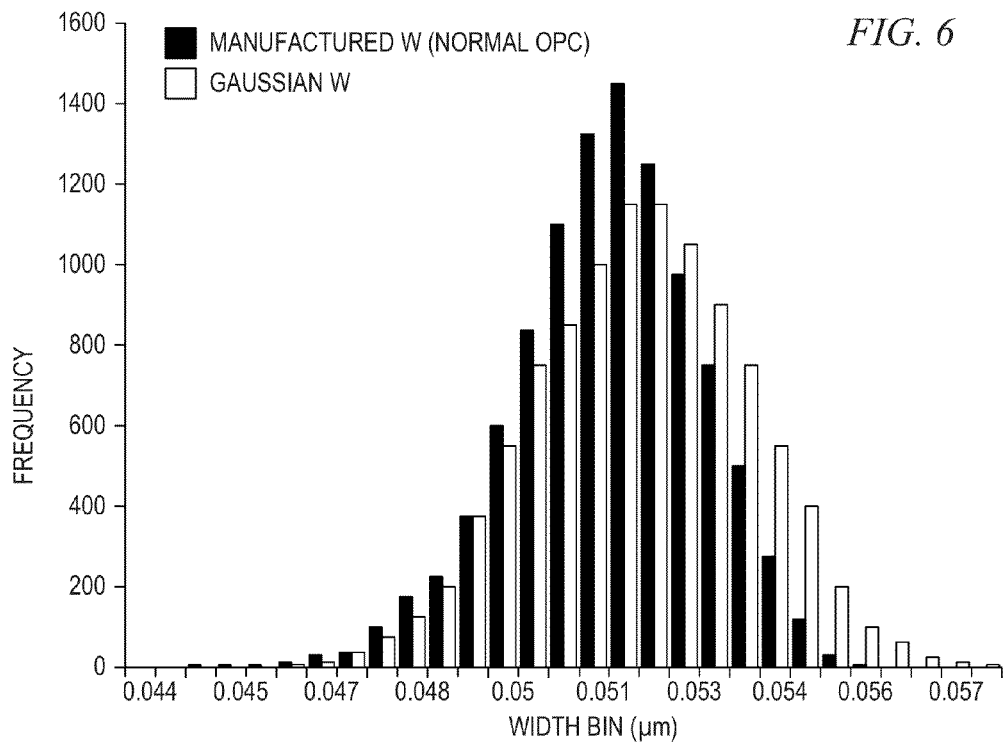
FIG. 6 illustrates RC distribution for manufactured and Gaussian width in accordance with an illustrative embodiment.

FIG. 6 exhibits one important aspect of analysis and illustrates RC distribution for manufactured and Gaussian width in accordance with an illustrative embodiment. In normal circuit simulation techniques, the geometric parameters of wires are assumed to behave in a Gaussian manner. This is labeled in FIG. 6 as "Gaussian". However, such an assumption is not true for the wire width (W). This parameter exhibits a highly skewed distribution due to the fact that width prints smaller if there is any defocus in the process (as evident in FIG. 5). So wires generally tend to print smaller, and do not follow a Gaussian distribution. This is accounted for in FIG. 6, with the legend "Manufactured", which shows that wire RC distributions can be very different from assumed values if manufacturing conditions are accounted for in the analysis.

Prior art techniques include retargeting for metal wires. Width/space dependent biasing for metal wires is an important step in 22-nm data preparation. One may obtain retargeting bias values by lithographic simulations for all width/space combinations in the permitted design space. Prior art techniques have no notion of the impact of lithographic variation on wire resistance (R) and capacitance (C). Prior art techniques retarget values based on process variation bands or lithographic process window, which is not necessarily optimal for RC variation or electrical process window.

Figure 7:
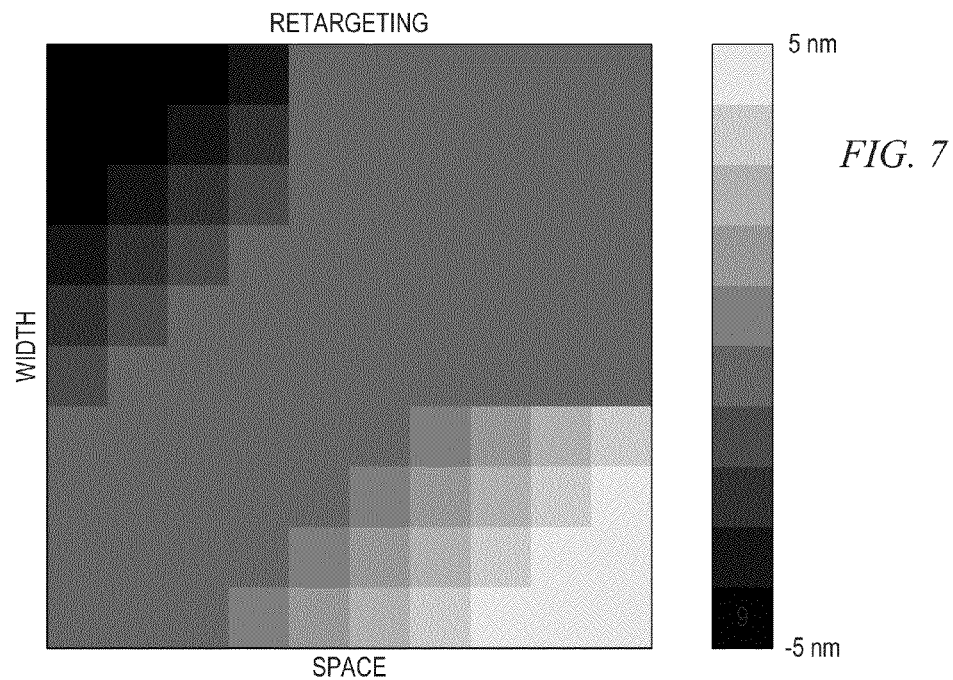
FIG. 7 illustrates a sample retargeting scheme, where the optimum values of target modification for different width and spacing combinations depicted accordance with an illustrative embodiment.

FIG. 7 shows a sample retargeting scheme, where the value of target modification for different combinations of space and width (on the X and Y axes respectively) is depicted by different shades of gray, in accordance with an illustrative embodiment. The values of target modification in this case range from −5 nm to +5 nm. Each value has been obtained by multiple lithography simulations in the permitted design space.

Figure 8:
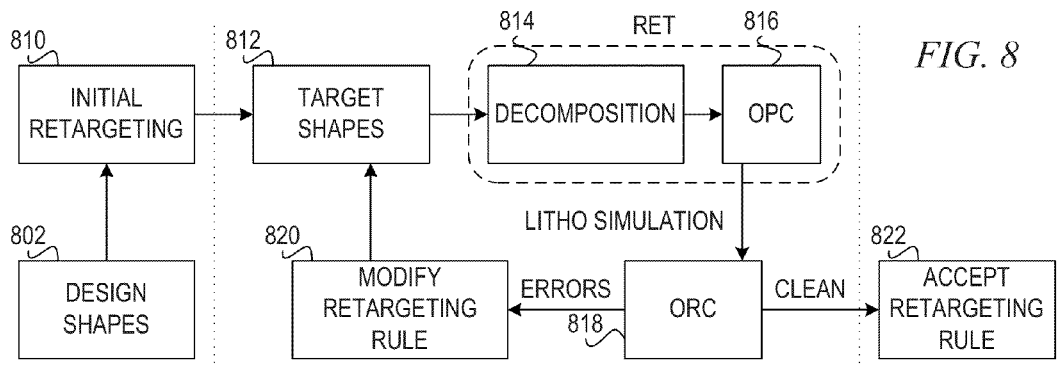
FIG. 8 is a diagram illustrating process flow of a mechanism for retargeting based on lithographic simulation in accordance with an example embodiment.

FIG. 8 is a diagram illustrating process flow of a mechanism for retargeting based on lithographic simulation in accordance with an example embodiment. The mechanism performs initial retargeting 810 on design shapes 802 resulting in target shapes 812. The mechanism performs resolution enhancement technique (RET) including decomposition 814 and optical proximity correction (OPC) 816. Decomposition is a technique for separating an image into components, often a vertical component and a horizontal component. Optical proximity correction is a photolithography enhancement technique commonly used to compensate for image errors due to diffraction or process effects. The mechanism then performs lithographic simulation and performs optical rules checking (ORC) 818. Optical rules checking is a technique for checking post-OPC images against drawn shapes using lithography simulation at multiple process corners. Retargeting, decomposition, OPC, and ORC are known techniques.

ORC 818 determines whether errors exist in the post-OPC images. If the images are clean, the mechanism accepts the current retargeting rule 822. If ORC 818 determines that errors exist, then the mechanism modifies the retargeting rule 820 to form new target shapes 812 for resolution enhancement techniques (RET). The mechanism repeats this process until the post-OPC images are clean. This process aims to achieve a lithographic image that is as close to the desired image as possible but precludes RC behavior of wires. Therefore, white the resulting image may visually look like the desired image, the electrical properties of the wires may still have undesirable delay variation due to through process variation.

Figure 9:
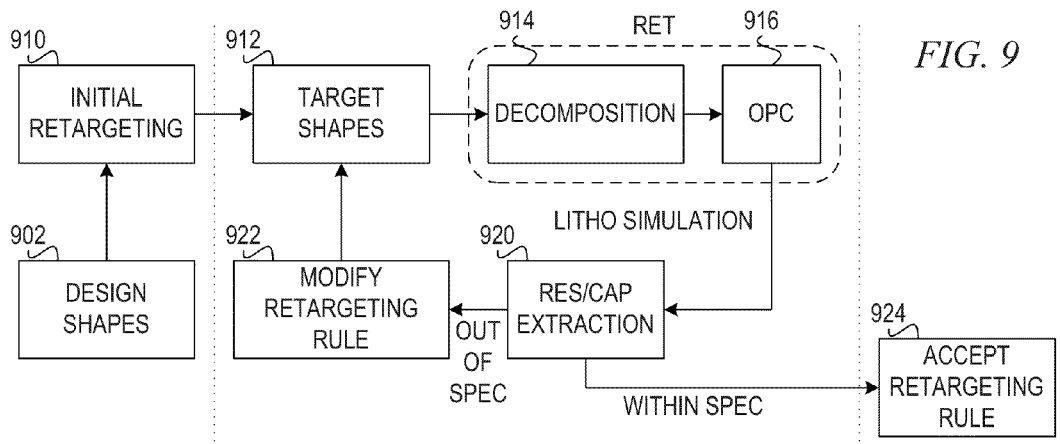
FIG. 9 is a diagram illustrating process flow of a mechanism for retargeting based on coupling lithography simulation and RC extraction in accordance with an example embodiment.

FIG. 9 is a diagram illustrating process flow of a mechanism for retargeting based on coupling lithography simulation and RC extraction in accordance with an example embodiment. The mechanism performs initial retargeting 910 on design shapes 902 resulting in target shapes 912. The mechanism performs resolution enhancement technique (RET) including decomposition 914 and optical proximity correction (OPC) 916.

The mechanism then performs resistance/capacitance extraction 920. Resistance and capacitance may be determined based on the wire shapes as described above with respect to FIGS. 2 and 3. Much of the brute force work of RC extraction is already being done for timing analysis. In resistance/capacitance extraction 920, the mechanism determines whether the RC properties of the wires are within predefined specifications or out of spec. If the design is within spec, the mechanism accepts the current retargeting rule 924; however, if the RC properties of the wires are out of spec, the mechanism modifies the retargeting rule 922 to form new target shapes 912 for resolution enhancement techniques (RET). The mechanism repeats this process until the wires in the post-OPC images are within spec.

In this flow, we are able to preclude the step of optical rule checking (ORC), or keep it as an optional step. This is because if there are any severe violations in the wire printability, these will automatically show up as violations of electrical conditions during RC extraction. The mechanism of FIG. 9 is accurate and captures non-linear dependencies of RC on dimensions. The mechanism may allow higher lithographic flexibility if RC constraints are met. In other words, the lithographic image may not look like the expected image, but the wires will perform as desired.

Figure 10:
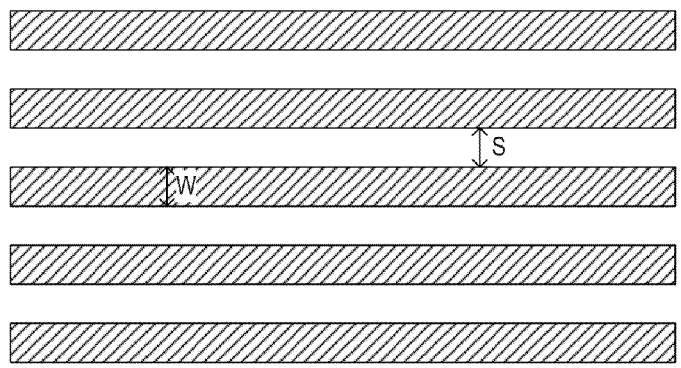
FIG. 10 depicts an example design in which aspects of the illustrative embodiments may be implemented.
Figure 11A:
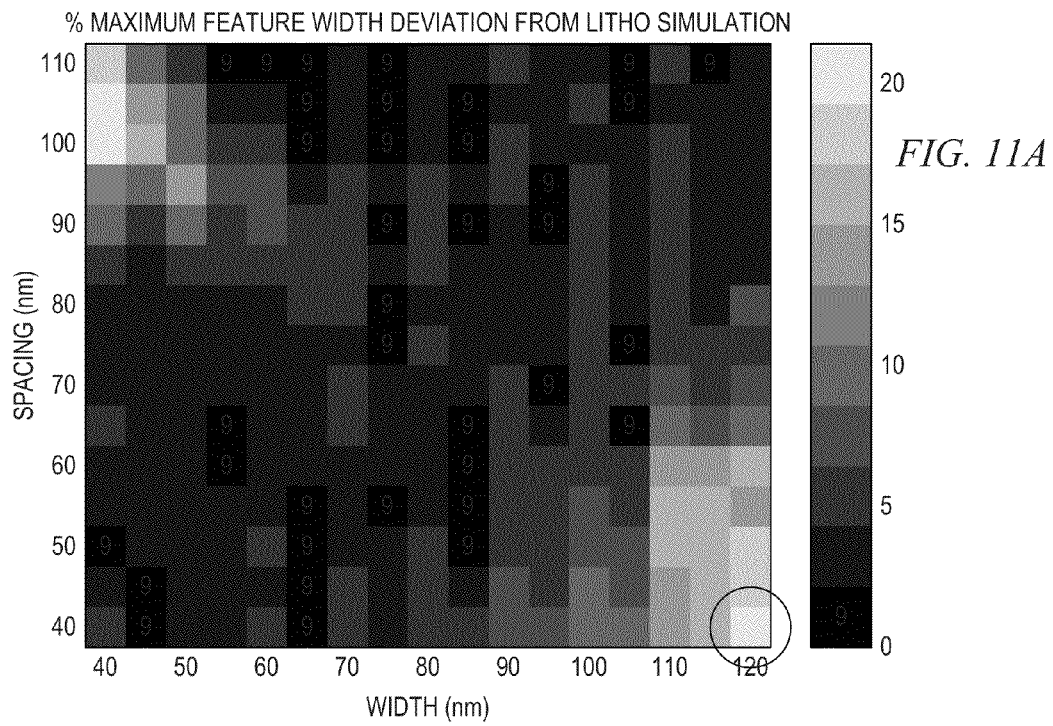
FIG. 11A illustrates observed percentage maximum feature width deviation from an example simulation in accordance with an example embodiment.
Figure 11B:
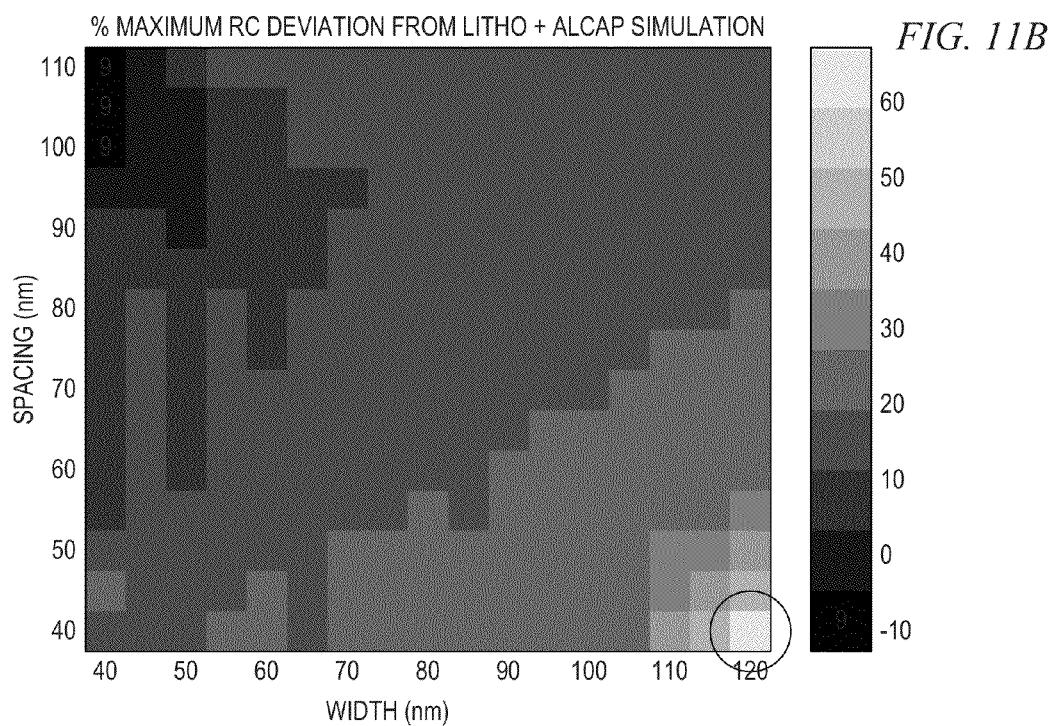
FIG. 11B illustrates observed percentage maximum RC deviation from lithographic simulation and electrical property simulation in accordance with an example embodiment.

FIG. 10 depicts an example design in which aspects of the illustrative embodiments may be implemented. FIG. 10 illustrates five parallel metal wires having a width and space between 40 nm and 120 nm. FIG. 11A illustrates observed percentage maximum feature width deviation from an example simulation in accordance with an example embodiment. As seen in FIG. 11A, the worst observed case is at small spacing and large width, as the observed result is approximately 20% off. FIG. 11B illustrates observed percentage maximum RC deviation from lithographic simulation and electrical property simulation in accordance with an example embodiment. As seen in FIG. 11B, the worst case is at small spacing and high width, as the observed result is approximately 60% off.

Figure 12A:
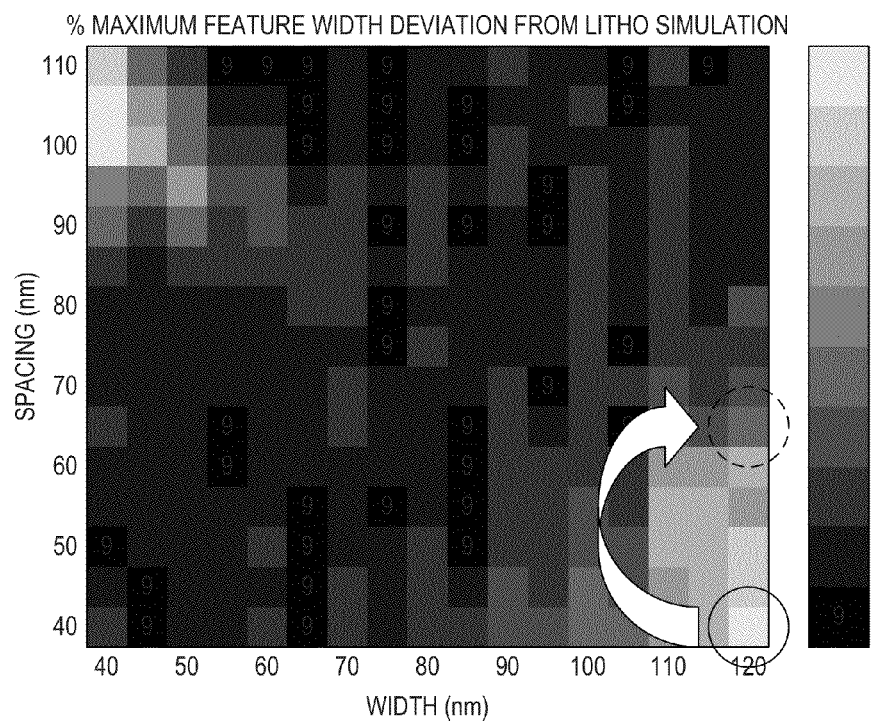
FIG. 12A illustrates lithography based space retargeting based on observed results in accordance with the example embodiments.
Figure 12B:
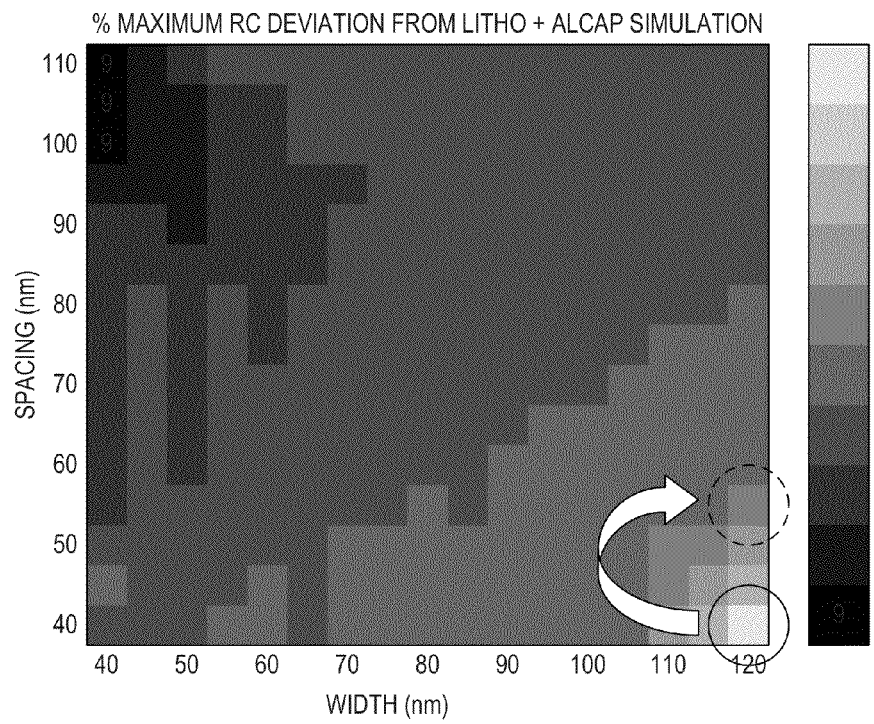
FIG. 12B illustrates RC-based space retargeting based on observed results in accordance with the example embodiments.

FIG. 12A illustrates lithography based space retargeting based on observed results in accordance with the example embodiments. Retargeting is required to control variability to within a predetermined amount, such as 10% for example. Litho-based retargeting requires large increments in spacing, such as approximately 20 nm, for example, as seen in FIG. 12A. FIG. 12B illustrates RC-based space retargeting based on observed results in accordance with the example embodiments. RC-based retargeting requires smaller increments in spacing, such as approximately 10 nm, for example, as seen in FIG. 12B.

Figure 13A:
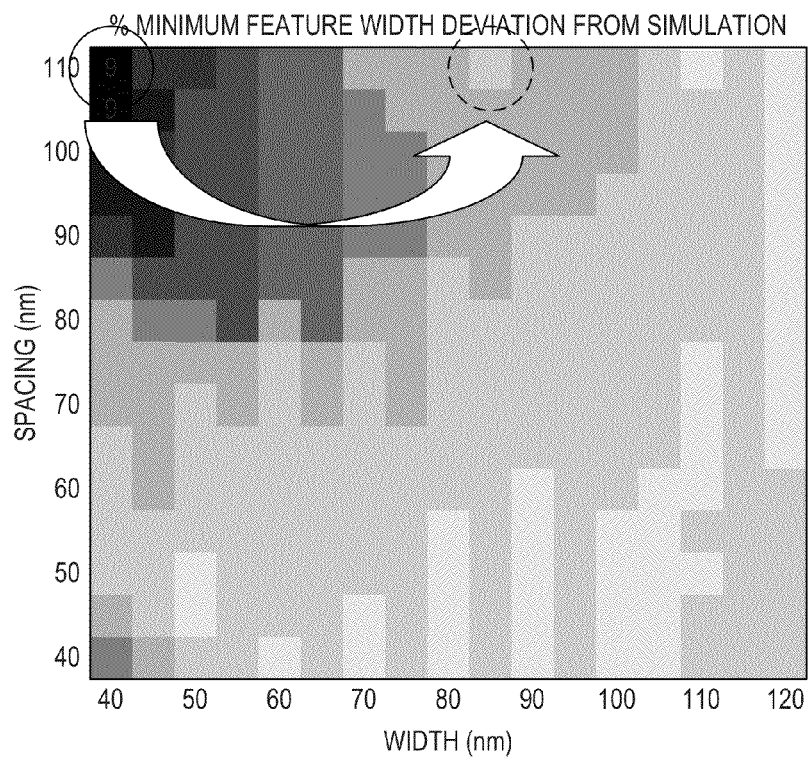
FIG. 13A illustrates lithography based width retargeting based on observed results in accordance with the example embodiments.
Figure 13B:
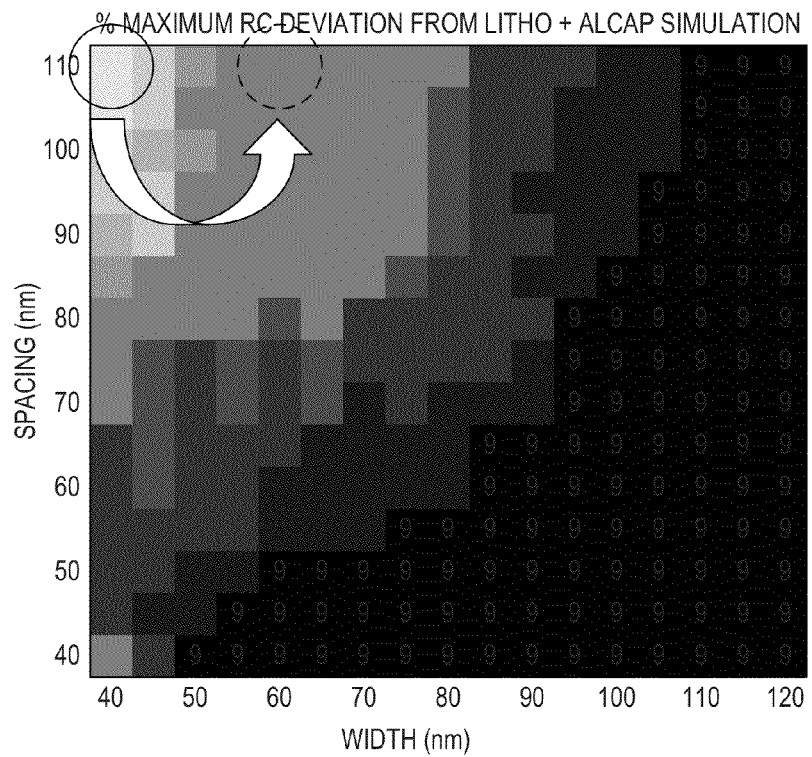
FIG. 13B illustrates RC-based width retargeting based on observed results in accordance with the example embodiments.

FIG. 13A illustrates lithography based width retargeting based on observed results in accordance with the example embodiments. As seen in FIG. 13A, a large width retargeting is requires at small space and small width. FIG. 13B illustrates RC-based width retargeting based on observed results in accordance with the example embodiments. With RC-based retargeting, smaller width retargeting is required, as seen in FIG. 13B.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 14:
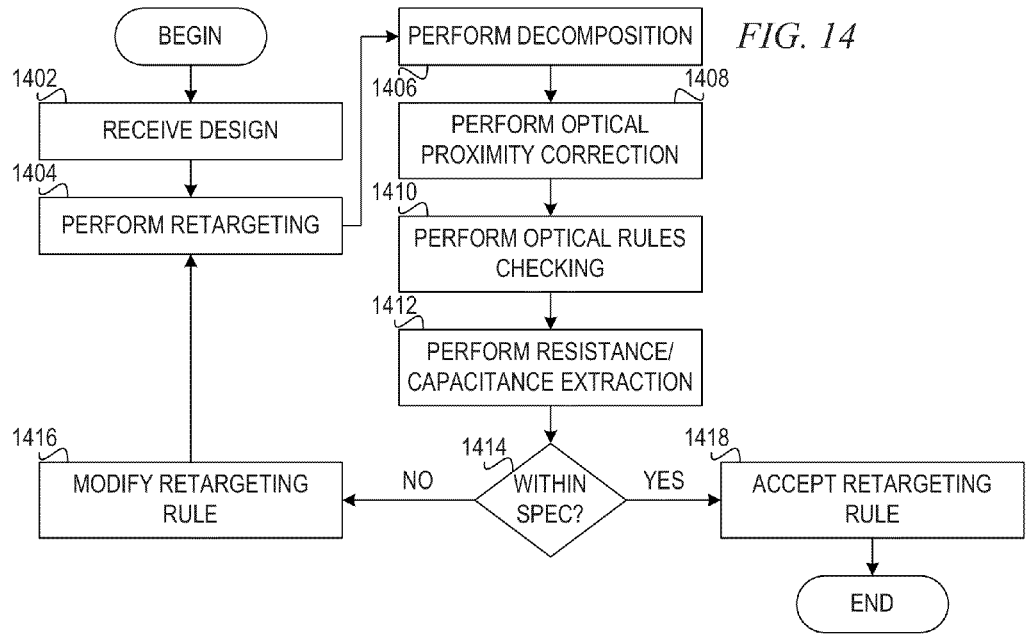
FIG. 14 is a flowchart illustrating operation of a mechanism for reducing process delay variation in metal wires in accordance with an illustrative embodiment.

FIG. 14 is a flowchart illustrating operation of a mechanism for reducing process delay variation in metal wires in accordance with an illustrative embodiment. Operation begins, and the mechanism receives a design for forming metal wires (block 1402). The mechanism performs retargeting to form target shapes to be formed using a lithographic process (block 1404). The mechanism then performs decomposition (block 1406) and performs optical proximity correction (OPC) (block 1408). The mechanism may perform decomposition to separate the design into vertical and horizontal components, which are used in separate exposures but together form the desired lithographic image. The mechanism performs OPC to modify the images such that the desired shapes are formed in the lithographic process.

The mechanism then optionally performs optical rules checking (ORC) (block 1410) and performs resistance/capacitance extraction (block 1412). The mechanism performs ORC to check the post-OPC images against drawn shapes. The mechanism performs resistance/capacitance extraction to determine resistance and capacitance properties of the metal wires based on the dimensions of the shapes, the resistivity of the metal wires, and the dielectric permittivity. The mechanism then determines whether the post-OPC images result in electrical properties that are within predefined specifications (block 1414). If the RC properties of the wires are not within spec, the mechanism modifies the retargeting rule (block 1416), and operation returns to block 1404 to perform retargeting. The mechanism then repeats the process until the RC properties of the wires are within spec. If the mechanism determines that the RC properties of the wires are within spec in block 1414, then the mechanism accepts the current retargeting rule (block 1418), and operation ends.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 15:
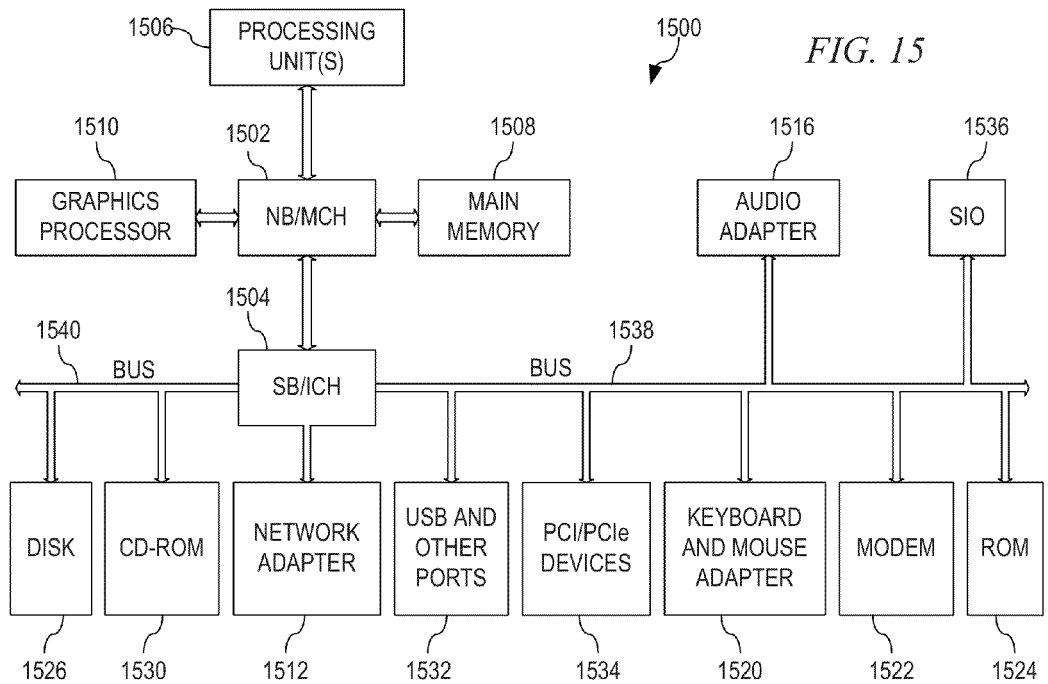
FIG. 15 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIG. 15 is provided hereafter as an example environment in which aspects of the illustrative embodiments may be implemented. It should be appreciated that FIG. 15 is only an example and is not intended to assert or imply any limitation with regard to the environments in which aspects or embodiments of the present invention may be implemented. Many modifications to the depicted environment may be made without departing from the spirit and scope of the present invention.

FIG. 15 is a block diagram of an example data processing system in which aspects of the illustrative embodiments may be implemented. Data processing system 1500 is an example of a computer in which computer usable code or instructions implementing the processes for illustrative embodiments of the present invention may be located.

In the depicted example, data processing system 1500 employs a hub architecture including north bridge and memory controller hub (NB/MCH) 1502 and south bridge and input/output (I/O) controller hub (SB/ICH) 1504. Processing unit 1506, main memory 1508, and graphics processor 1510 are connected to NB/MCH 1502. Graphics processor 1510 may be connected to NB/MCH 1502 through an accelerated graphics port (AGP).

In the depicted example, local area network (LAN) adapter 1512 connects to SB/ICH 1504. Audio adapter 1516, keyboard and mouse adapter 1520, modem 1522, read only memory (ROM) 1524, hard disk drive (HDD) 1526, CD-ROM drive 1530, universal serial bus (USB) ports and other communication ports 1532, and PCI/PCIe devices 1534 connect to SB/ICH 1504 through bus 1538 and bus 1540. PCI/PCIe devices may include, for example, Ethernet adapters, add-in cards, and PC cards for notebook computers. PCI uses a card bus controller, while PCIe does not. ROM 1524 may be, for example, a flash basic input/output system (BIOS).

HDD 1526 and CD-ROM drive 1530 connect to SB/ICH 1504 through bus 1540. HDD 1526 and CD-ROM drive 1530 may use, for example, an integrated drive electronics (IDE) or serial advanced technology attachment (SATA) interface. Super I/O (SIO) device 1536 may be connected to SB/ICH 1504.

An operating system runs on processing unit 1506. The operating system coordinates and provides control of various components within the data processing system 1500 in FIG. 15. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 1500 (Java is a trademark of Oracle and/or its affiliates.).

As a server, data processing system 1500 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 1500 may be a symmetric multiprocessor (SMP) system including a plurality of processors in processing unit 1506. Alternatively, a single processor system may be employed.

Instructions for the operating system, the object-oriented programming system, and applications or programs are located on storage devices, such as HDD 1526, and may be loaded into main memory 1508 for execution by processing unit 1506. The processes for illustrative embodiments of the present invention may be performed by processing unit 1506 using computer usable program code, which may be located in a memory such as, for example, main memory 1508, ROM 1524, or in one or more peripheral devices 1526 and 1530, for example.

A bus system, such as bus 1538 or bus 1540 as shown in FIG. 15, may be comprised of one or more buses. Of course, the bus system may be implemented using any type of communication fabric or architecture that provides for a transfer of data between different components or devices attached to the fabric or architecture. A communication unit, such as modem 1522 or network adapter 1512 of FIG. 15, may include one or more devices used to transmit and receive data. A memory may be, for example, main memory 1508, ROM 1524, or a cache such as found in NB/MCH 1502 in FIG. 15.

Those of ordinary skill in the art will appreciate that the hardware in FIG. 15 may vary depending on the implementation. Other internal hardware or peripheral devices, such as flash memory, equivalent non-volatile memory, or optical disk drives and the like, may be used in addition to or in place of the hardware depicted in FIG. 15. Also, the processes of the illustrative embodiments may be applied to a multiprocessor data processing system, other than the SMP system mentioned previously, without departing from the spirit and scope of the present invention.

Moreover, the data processing system 1500 may take the form of any of a number of different data processing systems including client computing devices, server computing devices, a tablet computer, laptop computer, telephone or other communication device, a personal digital assistant (PDA), or the like. In some illustrative examples, data processing system 1500 may be a portable computing device which is configured with flash memory to provide non-volatile memory for storing operating system files and/or user-generated data, for example. Essentially, data processing system 1500 may be any known or later developed data processing system without architectural limitation.

As noted above, it should be appreciated that the illustrative embodiments may take the form of an entirety hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for reducing delay variation in metal wires, the method comprising:

receiving a design comprising a plurality of metal wires;

performing retargeting on the design to form target shapes based on one or more retargeting rules;

performing resolution enhancement on the target shapes to form one or more corrected images;

performing lithographic simulation on the one or more corrected images to form a simulated design;

determining whether electrical properties of the simulated design meet predefined specifications; and responsive to the electrical properties of the simulated design not meeting the predefined specifications, modifying the one or more retargeting rules based on the electrical properties of the simulated design, wherein performing resolution enhancement comprises:

performing decomposition on the target shapes into two separate components for different exposures for double exposure lithography; and performing optical proximity correction on the two components to generate two masks for the different exposures.

2. The method of claim 1, wherein determining whether the electrical properties of the simulated design meet predefined specifications comprises:

determining resistance and capacitance of the plurality of metal wires in the simulated design; and determining whether the resistance and capacitance of the plurality of metal wires in the simulated design meet the predefined specifications.

3. The method of claim 1, wherein performing resolution enhancement further comprises performing optical rules checking on the two masks for the different exposures.

4. The method of claim 1, further comprising:

responsive to the electrical properties of the simulated design meeting the predefined specifications, accepting the one or more retargeting rules.

5. The method of claim 1, further comprising:

repeating performing retargeting, performing resolution enhancement, and performing lithographic simulation until the electrical properties of the simulated design meet the predefined specifications; and responsive to the electrical properties of the simulated design meeting the predefined specifications, accepting the one or more retargeting rules.

6. A computer readable storage medium having computer readable program code stored therein, wherein the computer readable program code, when executed on a computing device, causes the computing device to:

receive a design comprising a plurality of metal wires;

perform retargeting on the design to form target shapes based on one or more retargeting rules;

perform resolution enhancement on the target shapes to form one or more corrected images;

perform lithographic simulation on the one or more corrected images to form a simulated design;

determine whether electrical properties of the simulated design meet predefined specifications; and responsive to the electrical properties of the simulated design not meeting the predefined specifications, modify the one or more retargeting rules based on the electrical properties of the simulated design, wherein performing resolution enhancement comprises:

performing decomposition on the target shapes into two separate components for different exposures for double exposure lithography; and performing optical proximity correction on the two components to generate two masks for the different exposures.

7. The computer readable storage medium of claim 6, wherein determining whether the electrical properties of the simulated design meet predefined specifications comprises:

determining resistance and capacitance of the plurality of metal wires in the simulated design; and determining whether the resistance and capacitance of the plurality of metal wires in the simulated design meet the predefined specifications.

8. The computer readable storage medium of claim 6, wherein performing resolution enhancement further comprises:

performing optical rules checking on the two masks for the different exposures.

9. The computer readable storage medium of claim 6, wherein the computer readable program code further causes the computing device to:

responsive to the electrical properties of the simulated design meeting the predefined specifications, accepting the one or more retargeting rules.

10. The computer readable storage medium of claim 6, wherein the computer readable program code further causes the computing device to:

repeating performing retargeting, performing resolution enhancement, and performing lithographic simulation until the electrical properties of the simulated design meet the predefined specifications; and responsive to the electrical properties of the simulated design meeting the predefined specifications, accepting the one or more retargeting rules.

11. The computer readable storage medium of claim 6, wherein the computer readable program code is stored in a computer readable storage medium in a data processing system and wherein the computer readable program code was downloaded over a network from a remote data processing system.

12. The computer readable storage medium of claim 6, wherein the computer readable program code is stored in a computer readable storage medium in a server data processing system and wherein the computer readable program code is downloaded over a network to a remote data processing system for use in a computer readable storage medium with the remote system.

13. An apparatus, comprising:

a processor; and a memory coupled to the processor, wherein the memory comprises instructions which, when executed by the processor, cause the processor to:

receive a design comprising a plurality of metal wires;

perform retargeting on the design to form target shapes based on one or more retargeting rules;

perform resolution enhancement on the target shapes to form one or more corrected images;
perform lithographic simulation on the one or more corrected images to form a simulated design;
determine whether electrical properties of the simulated design meet predefined specifications; and
responsive to the electrical properties of the simulated design not meeting the predefined specifications, modify the one or more retargeting rules based on the electrical properties of the simulated design,
wherein performing resolution enhancement comprises:
performing decomposition on the target shapes into two separate components for different exposures for double exposure lithography; and
performing optical proximity correction on the two components to generate two masks for the different exposures.

14. The apparatus of claim 13, wherein determining whether the electrical properties of the simulated design meet predefined specifications comprises:
determining resistance and capacitance of the plurality of metal wires in the simulated design; and
determining whether the resistance and capacitance of the plurality of metal wires in the simulated design meet the predefined specifications.

15. The apparatus of claim 13, wherein performing resolution enhancement further comprises:
performing optical rules checking on the two masks for the different exposures.

16. The apparatus of claim 13, wherein the instructions further cause the processor to:
responsive to the electrical properties of the simulated design meeting the predefined specifications, accepting the one or more retargeting rules.

17. The apparatus of claim 13, wherein the instructions further cause the processor to:
repeating performing retargeting, performing resolution enhancement, and performing lithographic simulation until the electrical properties of the simulated design meet the predefined specifications; and
responsive to the electrical properties of the simulated design meeting the predefined specifications, accepting the one or more retargeting rules.

* * * * *